United States Patent
Chiu

(10) Patent No.: US 7,646,191 B2
(45) Date of Patent: Jan. 12, 2010

(54) METHOD FOR DETECTING LEADING EDGE BLANKING PARAMETER OF POWER MANAGEMENT CHIP

(75) Inventor: Chui-Hua Chiu, Hsin-Chu (TW)

(73) Assignee: Leadtrend Technology Corp., Hsin-Chu (TW)

( * ) Notice: Subject to any disclaimer, the term of this patent is extended or adjusted under 35 U.S.C. 154(b) by 308 days.

(21) Appl. No.: 11/867,004

(22) Filed: Oct. 4, 2007

(65) Prior Publication Data

US 2009/0091353 A1    Apr. 9, 2009

(51) Int. Cl.
    *G01D 1/14* (2006.01)
(52) U.S. Cl. ............ 324/76.13; 702/79; 702/117; 702/124; 702/176; 361/18
(58) Field of Classification Search ........... 324/76.13; 361/18, 41
    See application file for complete search history.

(56) References Cited

U.S. PATENT DOCUMENTS

| | | | |
|---|---|---|---|
| 3,790,767 A * | 2/1974 | Alexander | 702/108 |
| 7,126,320 B2 * | 10/2006 | Nicolaidis | 324/76.13 |
| 2006/0083037 A1 * | 4/2006 | Leung et al. | 363/98 |
| 2007/0007938 A1 * | 1/2007 | Djenguerian et al. | 323/284 |
| 2007/0019343 A1 * | 1/2007 | Barbehenn et al. | 361/18 |
| 2007/0024288 A1 * | 2/2007 | Hu | 324/547 |
| 2008/0055796 A1 * | 3/2008 | Chu et al. | 361/18 |
| 2008/0238750 A1 * | 10/2008 | Kris et al. | 341/155 |

* cited by examiner

*Primary Examiner*—Timothy J Dole
*Assistant Examiner*—Benjamin M Baldridge
(74) *Attorney, Agent, or Firm*—Winston Hsu

(57) ABSTRACT

A method for detecting a leading edge blanking parameter of a power management chip includes generating a pulse signal and inputting the pulse signal to the power management chip, wherein the amplitude of the pulse signal will cause a PWM signal of the power management chip to change its duty cycle; detecting the PWM signal to generate a detecting result; when the detecting result indicates that the duty cycle of the PWM signal does not change, adjusting a pulse width of the pulse signal to generate an adjusted pulse signal, inputting the adjusted pulse signal to the power management chip and detecting the PWM signal; and when the detecting result indicates that the duty cycle of the PWM signal changes, determining the leading edge blanking parameter of the power management chip according to the pulse width of the pulse signal.

9 Claims, 4 Drawing Sheets

METHOD FOR DETECTING LEADING EDGE BLANKING PARAMETER OF POWER MANAGEMENT CHIP

BACKGROUND OF THE INVENTION

1. Field of the Invention

The present invention relates to a chip detecting method, and more particularly, to a method of detecting a leading edge blanking parameter of a power management chip.

2. Description of the Prior Art

FIG. 1 is a simplified diagram of a conventional fly-back voltage converter 100. In the fly-back voltage converter 100, a chip 110 outputs a pulse signal via an output pin OUT to control the on/off status of a transistor Q1. By alternately turning the transistor Q1 on and off, the input voltage Vin is converted into the output voltage Vout. In order to prevent the primary current Ip of the fly-back voltage converter 100 from overgrowing and damaging elements of the fly-back voltage converter 100, the chip 110 further detects a voltage level Vcs at a current sensing pin CS. When the voltage level Vcs reaches a predetermined over-current protection reference voltage level, the chip 110 enables an over-current protection mechanism to control the pulse signal outputted from the output pin OUT to shut down the transistor Q1. As a result, the primary current Ip cuts off and the over-current situation is prevented.

However, voltage spikes will be generated when the transistor Q1 is turned on, instantly raising the voltage level Vcs detected at the current sensing pin CS. In this situation, it is easy to mistrigger the over-current protection mechanism to turn off the transistor Q1 without an over-current occurring, affecting the operation of the voltage converter 100. A common solution is to couple a low-pass-filter between the current sensing pin CS and the resistor Rcs. Although the low-pass-filter can decrease interference caused by the spikes to the detecting mechanism of the chip 110, it cannot completely eliminate the spikes; the possibility that the over-current protection mechanism will be mistriggered at the instant the transistor Q1 is turned on still exists. Another solution called "leading edge blanking" is to additionally create a blanking mechanism in the chip 110. The blanking mechanism blanks voltage signals detected by the current sensing pin CS at the instant of turning on the transistor Q1, and therefore the chip 110 will ignore the spikes generated when the transistor Q1 is turned on.

Power management chips having different usages comply with different leading edge blanking standards, but every leading edge blanking standard is designed to appropriately blank the spikes generated at the instant the transistor Q1 is turned on, thus avoiding interfering with the over-current protection function of the power management chip. In implementations, voltage signals detected by the current sensing pin CS are ignored (or the current detection function of the current sensing pin CS is paused) until a predetermined blanking time period passes. Since chips may be affected during manufacturing due to mechanical or artificial factors, an actual leading edge parameter of the chip may differ from the leading edge blanking standard originally designed for the chip. Too large a difference between the actual leading edge parameter of the chip and the leading edge blanking standard will influence the over-current protection in the power system. For example, when the blanking time period is too short, the chip may mistrigger the over-current protection mechanism easily because the spikes are detected; when the blanking time period is too long, an over-current occurrence may be ignored before the over-current protection mechanism is enabled, causing damage to the power system. Therefore, it is necessary to correctly measure a leading edge parameter of a chip, and determine whether the leading edge parameter conforms to the predefined standard of the chip.

SUMMARY OF THE INVENTION

One objective of the present invention is therefore to provide a method of detecting a leading edge blanking parameter of a power management chip, to solve the abovementioned problems.

According to an exemplary embodiment of the present invention, a method of detecting a leading edge blanking parameter of a power management chip disclosed. The method comprises: generating a pulse signal and inputting the pulse signal to the power management chip, wherein the amplitude of the pulse signal will cause a pulse width modulation (PWM) signal of the power management chip to change its duty cycle; detecting the PWM signal to generate a detecting result; when the detecting result indicates that the duty cycle of the pulse width modulation signal does not change, adjusting a pulse width of the pulse signal to generate an adjusted pulse signal, inputting the adjusted pulse signal to the power management chip and detecting the PWM signal; and when the detecting result indicates that the duty cycle of the PWM signal changes, determining the leading edge blanking parameter of the power management chip according to the pulse width of the pulse signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
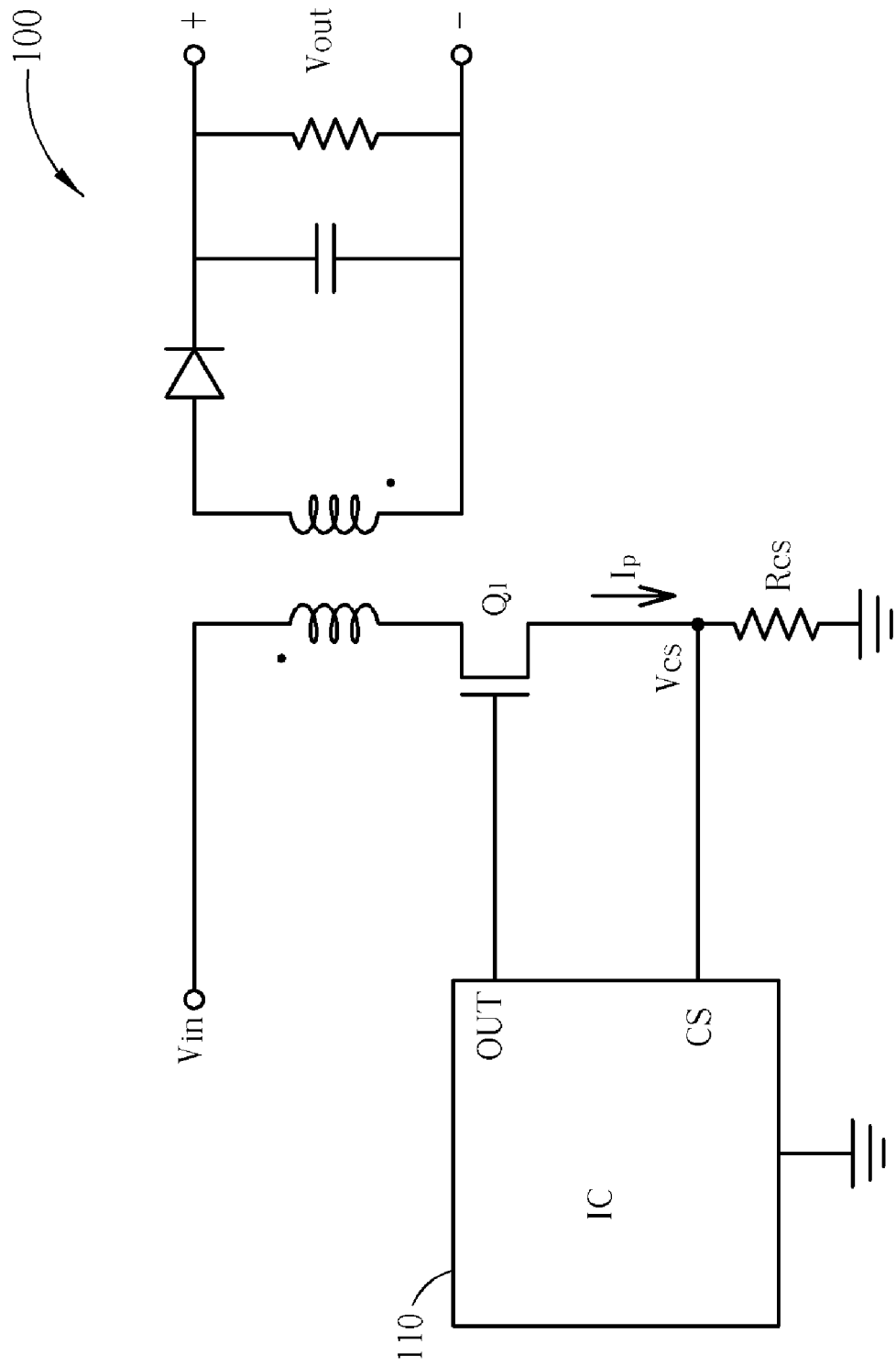
FIG. 1 is a simplified diagram of a conventional fly-back voltage converter.
Figure 2:
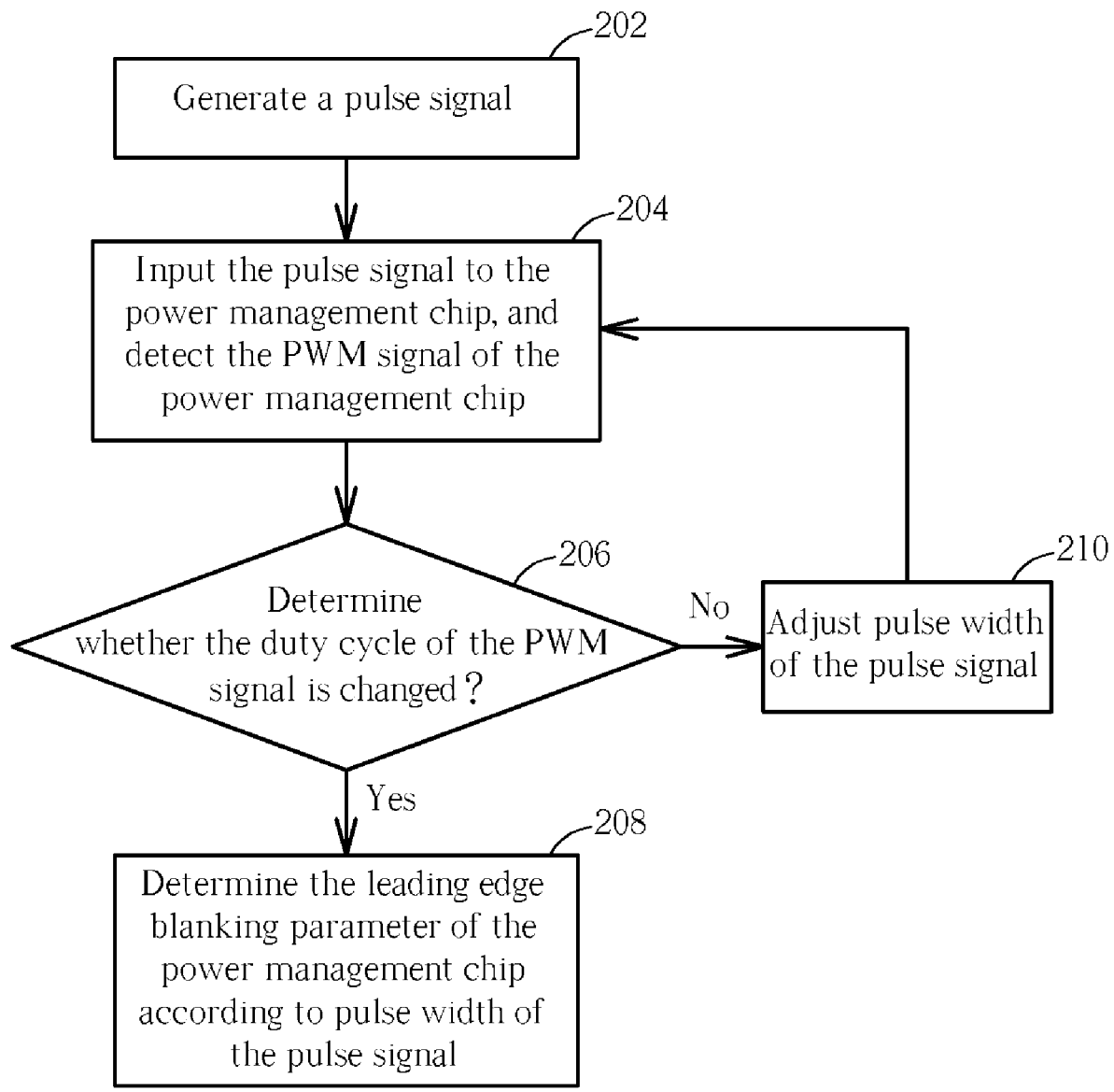
FIG. 2 is a flowchart showing a method of detecting a leading edge parameter of a power management chip according to an exemplary embodiment of the present invention.
Figure 3:
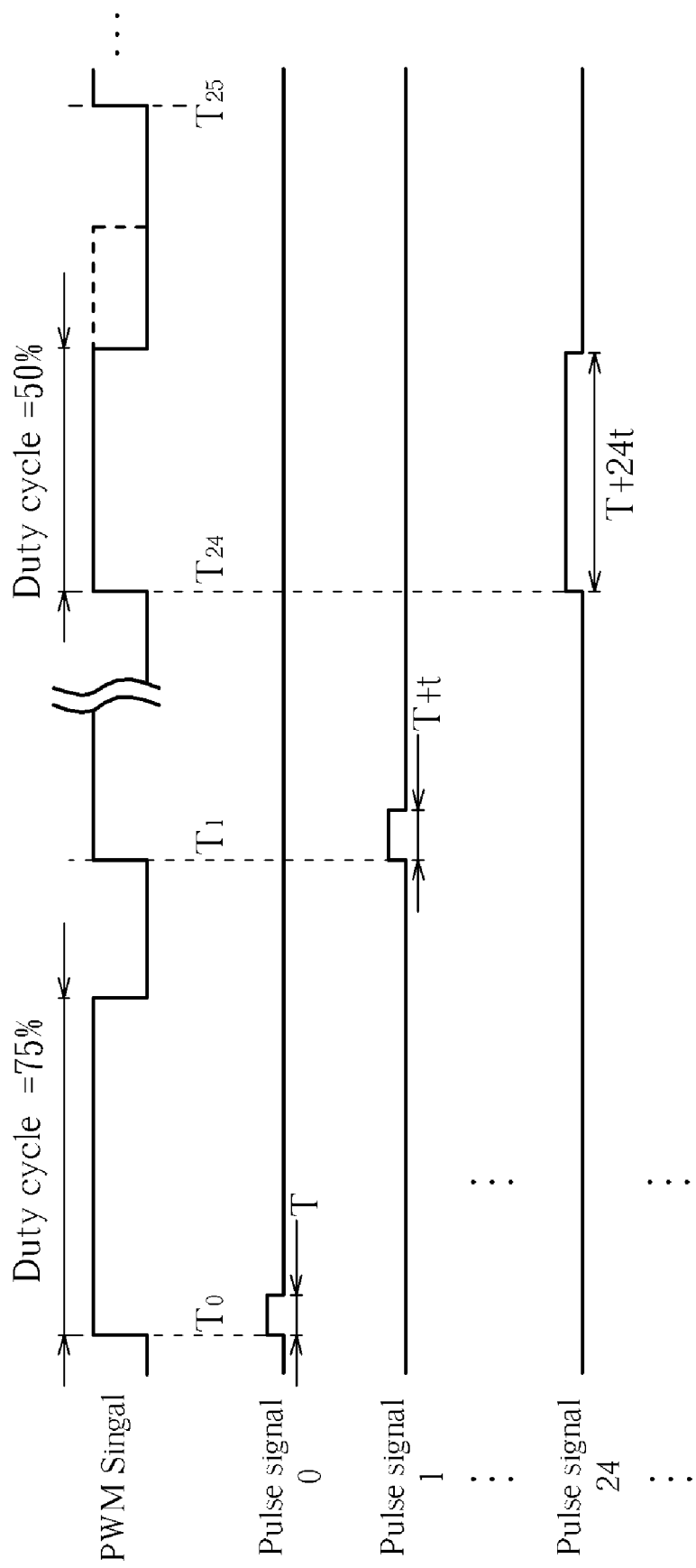
FIG. 3 is a diagram of a pulse signal used in the detection process shown in FIG. 2 and an output signal of a power management chip according to an exemplary embodiment of the present invention.
Figure 4:
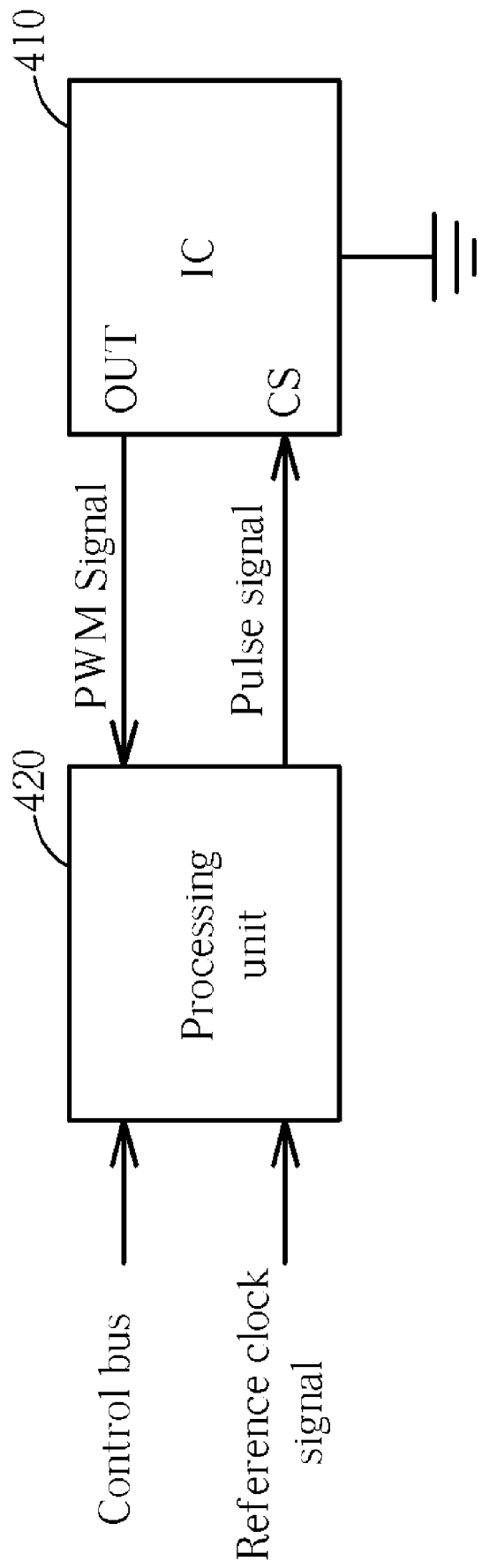
FIG. 4 shows a diagram of a detecting system performing the flowchart shown in FIG. 2 according to an exemplary embodiment of the present invention

Please refer to FIG. 2 to FIG. 4 in conjunction. FIG. 2 is a flowchart showing a method of detecting a leading edge parameter of a power management chip according to an exemplary embodiment of the present invention; FIG. 3 is a diagram of a pulse signal for detection and an output signal of a power management chip according to an exemplary embodiment of the present invention; FIG. 4 shows a diagram of a detecting system performing the method in the flowchart of FIG. 2 according to an exemplary embodiment of the present invention. A power management chip 410 outputs a PWM signal to control the turning on and off of a power system or some elements in the power system, such as the transistor Q1 in FIG. 1. In one instance, the power system or the elements are turned on when the PWM signal is high, and are turned off when the PWM signal is low. In this embodiment, the PWM signal is assumed to have a fixed duty cycle 75%; that is, the time length ratio of the high level to the low level in the PWM signal is 3:1.

When detecting the leading edge parameter, a processing unit 420 first generates a pulse signal, for example, the pulse signal 0 shown in FIG. 3 (Step 202). The pulse signal 0 has an initial pulse width T, and amplitude of the pulse signal 0 will cause the PWM signal of the power management chip 410 to change its duty cycle. For example, the amplitude of the pulse signal is larger than an over-current protection reference voltage level of the power management chip 410, so when the pulse signal is inputted to the power management chip 410, an over-current protection mechanism will be enabled, advancing the time of switching the PWM signal from the high level to the low level. Then, the processing unit 420 controls the pulse signal to synchronize a rising edge $T_0$ of the PWM signal, and inputs the pulse signal into a current sensing pin CS of the power management chip 410. After the pulse signal is inputted, the processing unit 420 further detects the PWM signal of the power management chip 410 (Step 204), and determine whether the duty cycle of the PWM signal is changed (Step 206). If the detection result indicates that the duty cycle decreased, it represents that the power management chip 410 has detected the inputted pulse signal and has enabled the over-current protection mechanism. The detecting process therefore proceeds to Step 208 to determine the leading edge blanking parameter of the power management chip 410 according to the pulse width of the pulse signal. In this regard, the leading edge parameter of the power management chip 410 is determined as the pulse width of corresponding pulse signal that the power management signal 410 detects and causes the over-current protection mechanism to be enabled.

Otherwise, if the detection result in Step 206 indicates that the duty cycle of the PWM signal is not changed, it represents that the over-current protection is not enabled, and the detection process proceeds to Step 210, adjusting the pulse width of the pulse signal to generate an adjusted pulse signal. Next, the detection process returns to Step 204 to synchronize the adjusted pulse signal with a rising edge (e.g., $T_1$ in FIG. 3) of the PWM signal, input the adjusted pulse signal to the power management chip 410, and then detect the state of the PWM signal again. If the detection result indicates that the duty cycle of the PWM signal is changed, determine the leading edge blanking parameter according to the pulse width of the adjusted pulse signal. However, if the duty cycle of the PWM signal is still not changed, repeat the above steps until reaching an adjusted pulse signal that causes a change in the duty cycle of the PWM signal.

In one embodiment, Step 210 sets an adjustment amount according to a reference clock signal, and sets the adjusted pulse width according to the initial pulse width T and the adjustment amount. The reference clock signal can be generated by an oscillator. In one embodiment, the reference clock signal is utilized to determine a time width t, and the adjustment amount is determined to be N times of the time width t, where N is the number of iterations the pulse signal has been adjusted. In implementation, N can be obtained from an input data of a control bus of the processing unit 420. Hence, in this embodiment, the pulse width of the adjusted pulse signal is the pulse width of the pulse signal before adjusting plus one time width t. As shown in FIG. 3, the pulse width of the pulse signal 0 is the initial pulse width T, and that of the adjusted pulse signal (pulse signal 1) is T+t. If the duty cycle of the PWM signal is not changed when the pulse signal 1 is inputted to the power management chip 410 at $T_1$ (the next rising time of the PWM signal), the processing unit 420 adjusts the pulse width of the pulse signal to T+2t, inputs this adjusted pulse signal to the power management chip 410 at the next rising time $T_2$ of the PWM signal, and then detects the state of the PWM signal. These steps will repeat until the duty cycle of the PWM signal is changed, and then the detection process enters Step 208 to determine the leading edge blanking parameter of the power management chip 410.

In one embodiment, as shown in FIG. 3, the processing unit 420 finds that the duty cycle of the PWM signal has decreased (for example, from the predefined 75% to 50%) when the pulse signal 24 with pulse width equal to T+24t, indicating that the over-current protection mechanism has been enabled. Step 208 therefore determines that the leading edge parameter of the power management chip 410 is the pulse width (T+24t) of the pulse signal 24.

When the leading edge parameter is detected, it can be compared with the predefined leading edge blanking standard to decide whether the power management chip 410 conforms to the standard. As mentioned before, a leading edge blanking parameter that is too long or too short will influence the over-current protection function of the power management chip 410. It should be noted that the present invention is not limited in deciding conformability of the leading edge blanking standard: other usages applying the leading edge blanking parameter detected by the detection process proposed in the present invention shall also fall within the scope of the present invention.

In one embodiment, the time width t is set to be 10 nanoseconds. Therefore, the error between the leading edge blanking parameter determined according to the pulse width of the pulse signal and the actual leading edge blanking parameter of the power management chip 410 will not be larger than 10 nanoseconds. In order to diminish the number of times to adjust the pulse signal and to reduce the time required for detection, the initial pulse width T can be chosen according to the properties of the power management chip 410. For example, let the initial pulse width T be smaller than the minimum of the leading edge blanking standard of the power management chip 410, and detect the actual leading edge blanking parameter of the power management chip 410 by gradually increasing the pulse width. In implementation, the processing unit 420 can be a CPU, a single chip IC, a programmable logic device (PLD), a complex programmable logic device (CPLD), a programmable array logic (PAL), a generic array logic (GAL), a field programmable gate array (FPGA), a transistor-transistor logic (TTL) or a combination of complementary metal oxide semiconductor (CMOS) logic ICs. The input of the control bus can be an X-bit digital sequence, for counting the number of that the processing unit 420 adjusts the pulse signal. When the control bus is 8-bit data input, the range of N is $0 \sim 2^8 - 1$, therefore the maximum pulse width in the above embodiment is T+255×t.

Those skilled in the art will readily observe that numerous modifications and alterations of the device and method may be made while retaining the teachings of the invention.

What is claimed is:

1. A method for detecting a leading edge blanking parameter of a power management chip, comprising:

generating a pulse signal, wherein a voltage amplitude of the pulse signal is larger than a reference voltage level necessary to cause a pulse width modulation (PWM) signal of the power management chip to change its duty cycle, and wherein a pulse width of the pulse signal may cause the PWM signal of the power management chin to change its duty cycle;

inputting the pulse signal to the power management chip, and detecting the duty cycle of the PWM signal of the power management chip to generate a detected result;

when the detected result indicates that the duty cycle of the PWM signal has not changed, adjusting a pulse width of the pulse signal to generate an adjusted pulse signal, inputting the adjusted pulse signal to the power management chip and detecting the duty cycle of the PWM signal; and when the detected result indicates that the duty cycle of the PWM signal has changed, determining the leading edge blanking parameter of the power management chip, the leading edge blanking parameter being substantially the pulse width of the inputted pulse signal that causes the pulse width modulation signal of the rower management chip to change its duty cycle.

2. The method of claim 1, further comprising:
synchronizing a rising edge of the pulse signal with a rising edge of the PWM signal.

3. The method of claim 2, further comprising:
synchronizing a rising edge of the adjusted pulse signal with a rising edge of the PWM signal.

4. The method of claim 1, wherein the pulse signal is inputted to a current sensing pin of the power management chip.

5. The method of claim 1, wherein the amplitude of the pulse signal is larger than an over-current protection reference voltage level of the power management chip.

6. The method of claim 1, wherein the step of generating the pulse signal further comprises:
setting an initial pulse width of the pulse signal according to a property of the power management chip.

7. The method of claim 6, wherein the initial pulse width of the pulse signal is less than a minimum of a leading edge blanking parameter standard of the power management chip.

8. The method of claim 6, wherein the step of adjusting the pulse width of the pulse signal comprises setting an adjustment amount according to a reference clock signal, and setting the pulse width of the adjusted pulse signal according to the initial pulse width and the adjustment amount.

9. The method of claim 1, further comprising:
determining whether the leading edge blanking parameter of the power management chip conforms to a predefined standard.

* * * * *